United States Patent
Han et al.

(10) Patent No.: US 8,126,087 B2
(45) Date of Patent: Feb. 28, 2012

(54) DC OFFSET CORRECTION CIRCUIT FOR CANCELING A DC OFFSET IN A REAL TIME AND A RECEIVING SYSTEM HAVING THE SAME

(75) Inventors: Ju Young Han, Suwon-si (KR); Dong Jin Keum, Suwon-si (KR); Ji Soo Jang, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 543 days.

(21) Appl. No.: 12/354,433

(22) Filed: Jan. 15, 2009

(65) Prior Publication Data
US 2009/0185639 A1    Jul. 23, 2009

(30) Foreign Application Priority Data
Jan. 15, 2008    (KR) .................. 10-2008-0004568

(51) Int. Cl.
*H04L 25/06* (2006.01)
(52) U.S. Cl. ........ 375/319; 375/316; 375/324; 375/340; 455/130; 327/307
(58) Field of Classification Search .................. 375/316, 375/319, 324, 340; 455/130; 327/307
See application file for complete search history.

(56) References Cited

U.S. PATENT DOCUMENTS
5,761,251 A * 6/1998 Wender .................. 375/345
7,835,467 B2 * 11/2010 Gupta .................... 375/319

FOREIGN PATENT DOCUMENTS
| EP | 1035691 | 9/2000 |
|----|---------|--------|
| JP | 06152409 | 5/1994 |
| JP | 2000278185 | 10/2000 |
| KR | 1020060044112 | 5/2006 |

* cited by examiner

*Primary Examiner* — Leon Flores
(74) *Attorney, Agent, or Firm* — F. Chau & Associates, LLC

(57) ABSTRACT

A DC offset correction circuit includes a DC offset detector generating a detection voltage based on a result of a comparison of a first reference voltage and a voltage difference between signals input to the DC offset detector, a comparator comparing a second reference voltage and the detection voltage and a third reference voltage and the detection voltage and outputting first and second comparison signals, respectively, as a result of the comparisons, and an up/down counter performing an up or a down count operation in response to one of the first or second comparison signals and, as a result of the up or down count operation, outputting a signal that causes at least one control signal for canceling a DC offset in a signal input to a receiver to be generated.

15 Claims, 5 Drawing Sheets

DC OFFSET CORRECTION CIRCUIT FOR CANCELING A DC OFFSET IN A REAL TIME AND A RECEIVING SYSTEM HAVING THE SAME

CROSS-REFERENCE TO RELATED APPLICATION

This application claims priority under 35 U.S.C. §119 to Korean Patent Application No. 10-2008-0004568, filed Jan. 15, 2008 in the Korean Intellectual Property Office, the disclosure of which is incorporated by reference herein in its entirety.

BACKGROUND

1. Technical Field

The present invention relates to a semiconductor device, and more particularly, to a DC offset correction circuit for canceling a DC offset included in an input signal, and a receiving system having the DC offset correction circuit.

2. Discussion of the Related Art

As semiconductor devices are made smaller and more integrated, different systems, for example, a transmitter and a receiver, are integrated in a single system like a multiband transceiver on one chip. A superheterodyne receiver, which is generally used, amplifies an input signal by always converting the input signal to the same intermediate frequency (IF) regardless of the frequency of the input signal. While having excellent performance and being easily embodied, the superheterodyne receiver includes a plurality of filters, amplifiers, and other circuits for the several time conversions of the frequency of the input signal. Thus, the configuration of a system with a superheterodyne receiver is complicated and the manufacturing cost thereof is high.

As a result, demand for a direct conversion receiver that transmits data without the conversion to IF is increasing. The direct conversion receiver decodes an input signal directly from a high frequency signal that is received thereby without having to perform a frequency conversion, unlike the superheterodyne receiver.

Compared to the superheterodyne receiver, since the number of parts of the direct conversion receiver may be reduced, the direction conversion receiver may have features such as high integration and low power consumption. In addition, since the structure of the direct conversion receiver is not complex, the cost of manufacturing a one-chip system therewith may be reduced.

However, the direct conversion receiver's oscillation frequency may drift, its frequency selection can be compromised, and it may create a DC offset. Accordingly, a receiving sensitivity of a direct conversion receiver is deteriorated. In particular, since the DC offset distorts the original input signal to be decoded, even though the distorted signal is received and decoded, the original signal may not be obtained.

Thus, the direct conversion receiver uses a DC offset correction (DCOC) circuit to cancel a DC offset included in the input signal. In general, a digital-to-analog converter (DAC) and a high pass filter are used as the DCOC circuit.

Although a DAC occupies a small area, it can be inadequate for a system, for example, Wideband Code Division Multiple Access (WCDMA), that receives in real time or continuously a signal having a DC offset that may frequently change according to a receiving environment.

Thus, a system like WCDMA uses a high pass filter to cancel the DC offset included in the input signal. However, although the high pass filter may cancel in real time or continuously the DC offset included in the input signal, it occupies a large area. In addition, the high pass filter cuts off not only a signal having no frequency, for example, a DC signal, but also a signal having a low frequency, for example, a low frequency AC signal. Thus, the amplitude of the input signal is attenuated and the input signal may be distorted.

Thus, since a DC or a low frequency signal includes information meaningful for modulation, a high pass filter can be designed such that a cut-off frequency, for example, −3 dB frequency, is close to DC so as to not deteriorate the signal's quality. However, since the high pass filter requires a higher resistance and capacitance to achieve the −3 dB frequency, the high pass filter may occupy an even larger area on a chip. Consequently, there is a need for a DCOC circuit having a small layout and that can cancel in real time a DC offset included in an input signal.

SUMMARY OF THE INVENTION

According to an exemplary embodiment of the present invention, there is provided a DC offset correction circuit comprising a DC offset detector generating a detection voltage based on a result of a comparison of a first reference voltage and a voltage difference between signals input to the DC offset detector, a comparator comparing a second reference voltage and the detection voltage and a third reference voltage and the detection voltage and outputting first and second comparison signals, respectively, as a result of the comparisons, and an up/down counter performing an up or a down count operation in response to one of the first or second comparison signals and, as a result of the up or down count operation, outputting a signal that causes at least one control signal for canceling a DC offset in a signal input to a receiver to be generated.

The comparator may comprise a first comparator comparing the detection voltage and the second reference voltage and outputting the first comparison signal and a second comparator comparing the detection voltage and the third reference voltage and outputting the second comparison signal.

The DC offset correction circuit may further comprise a digital-to-analog converter that converts the signal output from the up/down counter, which is a digital signal, to an analog signal to generate a first control signal and a second control signal.

The DC offset correction circuit may further comprise a control unit outputting a reset signal in response to at least one of the first or second comparison signals and a switching unit initializing the detection voltage to the first reference voltage in response to the reset signal.

The comparator may increase a first pulse width of the first comparison signal to a first logic level of the first comparison signal during a first time in which the detection voltage reaches the second reference voltage, and a second pulse width of the second comparison signal to a first logic level of the second comparison signal during a second time in which the detection voltage reaches the third reference voltage. The first or second pulse widths may be increased according to an amount of the detection voltage.

The second reference voltage may be higher than the first reference voltage and the third reference voltage may be lower than the first reference voltage.

The DC offset correction circuit may further comprise a low pass filter low pass filtering signals output from the receiver and outputting the low pass filtered signals as the signals input to the DC offset detector.

According to an exemplary embodiment of the present invention, there is provided a receiving system comprising a receiving circuit receiving differential input signals each including a DC offset amplifying the received differential input signals and outputting the amplified differential signals as differential output signals and a DC offset correction circuit canceling the DC offset included in each of the differential input signals by providing control signals that correspond to the DC offset in each of the differential output signals to the receiving circuit, wherein the DC offset correction circuit may comprise a DC offset detector generating a detection voltage based on a result of a comparison of a first reference voltage and a voltage difference between the differential output signals received thereby, a comparator comparing a second reference voltage and the detection voltage and a third reference voltage and the detection voltage and outputting first and second comparison signals, respectively, as a result of the comparisons, and an up/down counter performing an up or a down count operation in response to one of the first or second comparison signals and, as a result of the up or down count operation, outputting a signal that causes the control signals to be generated.

The comparator may comprise a first comparator comparing the detection voltage and the second reference voltage and outputting the first comparison signal; and a second comparator comparing the detection voltage and the third reference voltage and outputting the second comparison signal.

The DC offset correction circuit may further comprise a digital-to-analog converter that converts the signal output from the up/down counter, which is a digital signal, to an analog signal to generate the control signals.

The DC offset correction circuit may further comprise a control unit outputting a reset signal in response to at least one of the first or second comparison signals and a switching unit initializing the detection voltage to the first reference voltage in response to the reset signal.

The comparator may increase a first pulse width of the first comparison signal to a first logic level of the first comparison signal during a first time in which the detection voltage reaches the second reference voltage, and a second pulse width of the second comparison signal to a first logic level of the second comparison signal during a second time in which the detection voltage reaches the third reference voltage. The first or second pulse widths may be increased according to an amount of the detection voltage.

The second reference voltage may be higher than the first reference voltage and the third reference voltage may be lower than the first reference voltage.

The DC offset correction circuit may further comprise a low pass filter low pass filtering the differential output signals and outputting the low pass filtered signals to the DC offset detector.

According to an exemplary embodiment of the present invention, a method for canceling a DC offset in signals input to a receiving circuit, comprises: receiving, at a receiving circuit, first and second input signals each including a DC offset; amplifying, at the receiving circuit, the first and second input signals; outputting, from the receiving circuit, the amplified first and second input signals as first and second output signals; receiving, at a DC offset correction circuit, the first and second output signals; generating, at the DC offset correction circuit, a detection voltage based on a result of a comparison of a first reference voltage and a voltage difference between the first and second output signals; comparing, at the DC offset correction circuit, a second reference voltage and the detection voltage and a third reference voltage and the detection voltage and outputting first and second comparison signals, respectively, as a result of the comparisons; performing, at the DC offset correction circuit, an up or a down count operation in response to one of the first or second comparison signals and, as a result of the up or down count operation, outputting a digital signal; generating, at the DC offset correction circuit, first and second control signals in response to the digital signal; outputting, from the DC offset correction circuit, the first and second control signals; and adding or subtracting the first and second control signals to/from the first and second input signals, respectively, to cancel the DC offset included therein.

A pulse width of the first comparison signal may be increased or decreased based on a time it takes the detection voltage to reach the second reference voltage and a pulse width of the second comparison signal may be increased or decreased based on a time it takes the detection voltage to reach the third reference voltage.

A value of the digital signal depends on the pulse width of at least one of the first or second comparison signals and the value of the digital signal determines how much voltage is to be added to or subtracted from the first and second input signals.

BRIEF DESCRIPTION OF THE DRAWINGS

The above and other features of the present invention will become more apparent by describing in detail exemplary embodiments thereof with reference to the accompanying drawings in which.

DETAILED DESCRIPTION OF EXEMPLARY EMBODIMENTS

Exemplary embodiments of the present invention will be described more fully hereinafter with reference to the accompanying drawings. This invention may, however, be embodied in many different forms and should not be construed as limited to the embodiments set forth herein.

Figure 1:
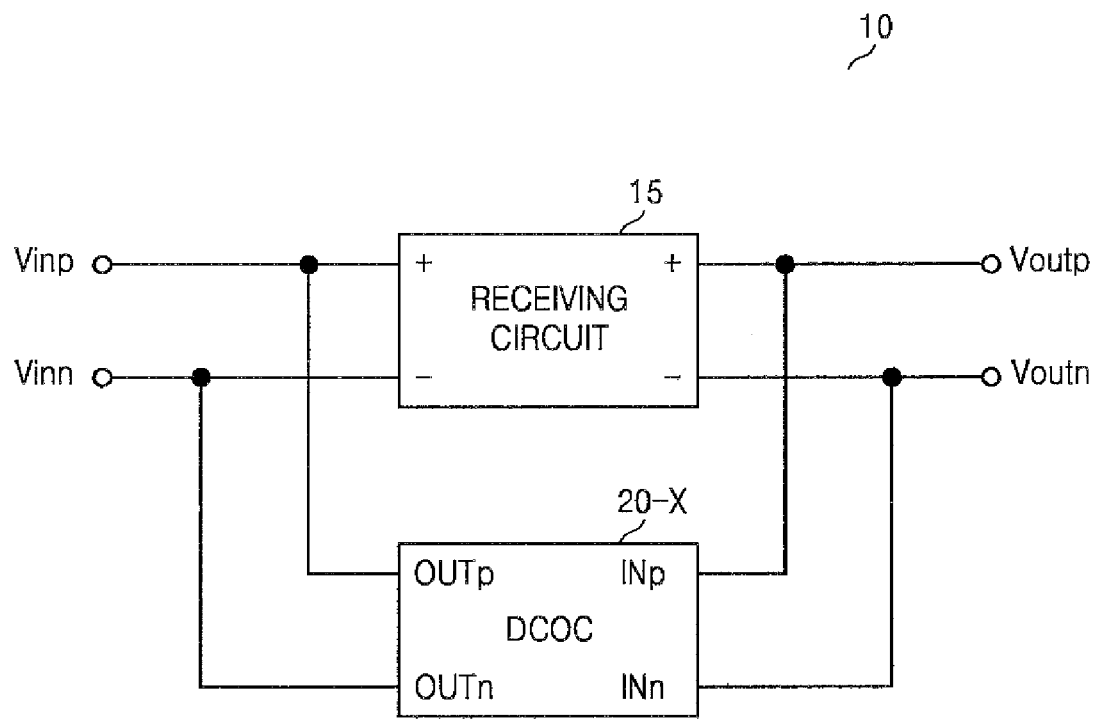
FIG. 1 is a block diagram of a receiving system capable of canceling a DC offset included in each input signal according an exemplary embodiment of the present invention.

FIG. 1 is a block diagram of a receiving system 10 capable of canceling a DC offset included in each input signal according an exemplary embodiment of the present invention. Referring to FIG. 1, the receiving system 10 includes a receiving circuit 15 and a DC offset correction (DCOC) circuit 20-X, where X is a natural number.

The receiving circuit 15 determines data by decoding a first input signal Vinp input through a first input terminal (+) and a second input signal Vinn input through a second input terminal (−), and outputs the determined data to a first output terminal (+) and a second output terminal (−).

However, while passing through a transmission path, for example, a cable or a channel, the first input signal Vinp and the second input signal Vinn are distorted, for example, an amplitude or a phase thereof may be distorted, due to a variety of factors, thereby causing the signals Vinp and Vinn to include a DC offset. Accordingly, the DC offset included in each of the received first input signal Vinp and the received second input signal Vinn generates noise so that a signal-to-noise (S/N) ratio of these signals is deteriorated. Thus, the receiving system 10 uses a circuit for correcting or canceling the DC offset in each of the first and second input signals Vinp and Vinn. The first and second input signals Vinp and Vinn may be differential signals or complementary signals, but the present exemplary embodiment is not limited thereto.

The DCOC circuit 20-X receives a first output signal Voutp output from the first output terminal (+) and a second output signal Voutn output from the second output terminal (−), respectively, as input signals INp and INn. The DCOC circuit 20-X detects the DC offset included in each of the input signals INp and INn and generates a first control signal OUTp and a second control signal OUTn corresponding to the detected DC offset. The input signals Np and INn of the DCOC circuit 20-X are respectively referred to as a first feedback input signal INp and a second feedback input signal INn.

In the receiving system 10 according to the present exemplary embodiment, the first and second control signals OUTp and OUTN, respectively, generated based on the first and second feedback input signals INp and INn are respectively fed back to the first and second input terminals (+) and (−) of the receiving circuit 15 via the DCOC circuit 20-X. The fed back first and second control signals OUTp and OUTn are respectively added to the first and second input signals Vinp and Vinn of the receiving circuit 15, or subtracted from the first and second input signals Vinp and Vinn of the receiving circuit 15, so that the DC offset included in the first and second input signals Vinp and Vinn of the receiving circuit 15 may be canceled. For example, the receiving circuit 15 may be a direct conversion receiver.

Figure 2:
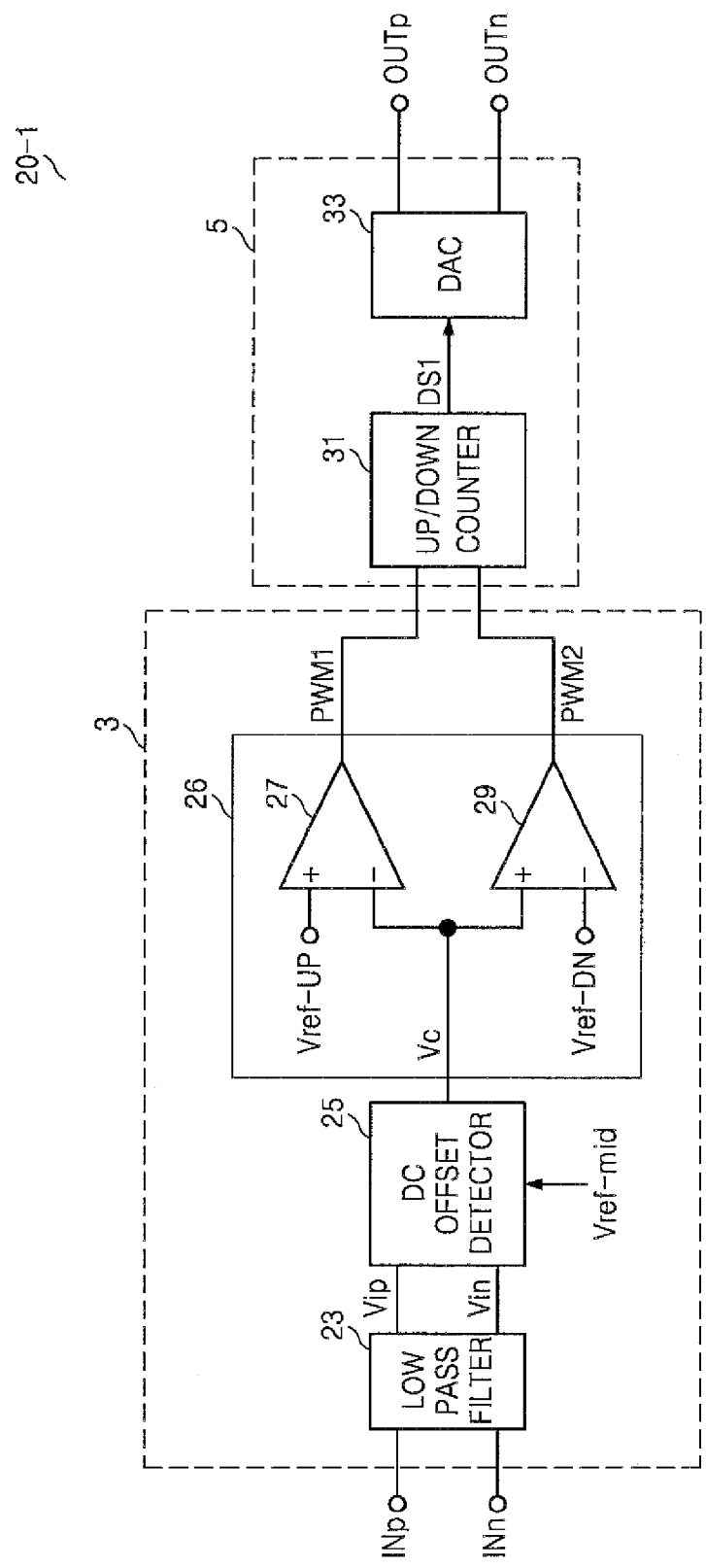
FIG. 2 is a block diagram of a DC offset correction circuit according an exemplary embodiment of the present invention.

FIG. 2 is a block diagram of a DCOC circuit 20-1 according an exemplary embodiment of the present invention. Referring to FIG. 2, the DCOC circuit 20-1 includes an analog circuit portion 3 and a digital circuit portion 5. The analog circuit portion 3 includes a low pass filter 23, a DC offset detector 25, and a comparator 26. The digital circuit portion 5 includes an up/down counter 31 and a digital-to-analog converter (DAC) 33.

The low pass filter 23 receives the first feedback input signal INp=Voutp and the second feedback input signal INn=Voutn and outputs a first low pass filtered signal Vip and a second low pass filtered signal Vin by low pass filtering the received first and second feedback input signals INp and INn based on a cut-off frequency corresponding thereto. In other words, the low pass filter 23 may remove noise of an unnecessary high frequency component included in each of the first and second feedback input signals INp and INn based on each signal's corresponding cut-off frequency.

The cut-off frequency is set by, for example, a resistance of a resistor and a capacitance of a capacitor. The cut-off frequency for low pass filtering the first feedback input signal INp and the cut-off frequency for low pass filtering the second feedback input signal INn may be the same or not. The first and second feedback input signals INp and INn may be differential signals or complementary signals, but the present exemplary embodiment is not limited thereto.

The DC offset detector 25 receives the first and second low pass filtered signals Vip and Vin output from the low pass filter 23, and detects a DC offset included in at least one of the first and second feedback input signals INp and INn based on a difference in voltage between the received first and second low pass filtered signals Vip and Vin. The DC offset detector 25 compares a detected DC offset and a first reference voltage Vref_mid and generates a detection voltage Vc according to a result of the comparison. The detection voltage Vc has a positive (+) sign and a negative (−) sign according to a result of the comparison between the DC offset and the first reference voltage Vref_mid.

For example, the DC offset detector 25 outputs the detection voltage Vc having a positive (+) sign when the DC offset is greater than the first reference voltage Vref_mid and the detection voltage Vc having a negative (−) sign when the DC offset is less than the first reference voltage Vref_mid. The comparator 26 includes a first comparator 27 and a second comparator 29.

The first comparator 27 receives a second reference voltage Vref_UP via a first input terminal (+) and the detection voltage Vc output from the DC offset detector 25 via a second input terminal (−), compares the received second reference voltage Vref_UP and the received detection voltage Vc, and outputs a first comparison signal PWM1 according to a result of the comparison. For example, the first comparator 27 receives the detection voltage Vc having a positive (+) sign and the second reference voltage Vref_UP and outputs a first comparison signal PWM1 obtained by increasing a first pulse width corresponding to a first logic level, for example, a high level, based on the time for the received detection voltage Vc to reach the second reference voltage Vref_UP.

In addition, when receiving the detection signal Vc having a negative (−) sign, the first comparator 27 may be operated or not. The second comparator 29 receives the detection voltage Vc via a first input terminal (+) and a third reference voltage Vref_DN via a second input terminal (−), compares the received detection voltage Vc and the received third reference voltage Vref_DN, and outputs a second comparison signal PWM2 according to a result of the comparison. For example, the second comparator 29 receives the detection voltage Vc having a negative (−) sign and the third reference voltage Vref_DN and outputs the second comparison signal PWM2 obtained by increasing a second pulse width corresponding to the first logic level, for example, a high level, based on the time for the received detection voltage Vc to reach the third reference voltage Vref_DN. In addition, when receiving the detection signal Vc having a positive (+) sign, the second comparator 29 may be operated or not. The second reference voltage Vref_UP is higher than the first reference voltage Vref_mid while the third reference voltage Vref_DN is lower than the first reference voltage Vref_mid. The first comparator 27 outputs the first comparison signal PWM1 using a pulse width modulation (PWM) method. The second comparator 29 outputs the second comparison signal PWM2 using the PWM method.

According to the PWM method, a signal is modulated by changing the width of a pulse according to a modulation signal, for example, an input signal. As the amplitude of an input signal increases, the width of a pulse increases. As the amplitude of an input signal decreases, the width of a pulse decreases. However, the position or amplitude of the pulse remains unchanged.

In other words, the first and second comparators 27 and 29 respectively output the first and second comparison signals PWM1 and PWM2 having pulse widths adjusted based on the amplitudes of the received input signals, for example, the second reference voltage Vref_UP and the detection voltage Vc, or the detection voltage Vc and the third reference voltage Vref_DN. The pulse width increases as the detection voltage Vc, for example, the amount (or amplitude) of the DC offset included in the first and second feedback input signals INp and INn, decreases.

The first and second comparison signals PWM1 and PWM2, respectively, output from the first and second comparators 27 and 29 will be described below in detail with reference to FIGS. 4 and 5. The up/down counter 31, in response to the first or second comparison signals PWM1 or PWM2 output from the comparator 26, performs an up count operation or a down count operation and outputs an n-bit digital signal DS1, where "n" is a natural number. The up/down counter 31 performs the up count operation and outputs the n-bit digital signal DS1, in response to the first comparison signal PWM1 output from the first comparator 27, and performs the down count operation and outputs the n-bit digital signal DS1 in response to the second comparison signal PWM2 output from the second comparator 29.

The up/down counter 31 performs the up or down count operation and outputs the n-bit digital signal DS1 according to the width of a pulse width corresponding to a first logic level, for example, a high level, of the first comparison signal PWM1 and/or the second comparison signal PWM2. When the up count operation is performed, the n-bit digital signal DS1 has a larger value as the width of the pulse width corresponding to the first logic level decreases and a smaller value as the width of the pulse width corresponding to the first logic level increases. For example, for 4-bit digital signal DS1 initially set to be "1000", the up/down counter 31 outputs the 4-bit digital signal DS1 increased to "1001", "1010", . . . or "1111" according to the width of the pulse width corresponding to the first logic level of the first comparison signal PWM1.

When the down count operation is performed, the n-bit digital signal DS1 has a smaller value as the width of the pulse width corresponding to the first logic level, for example, a high level, decreases and a larger value as the width of the pulse width corresponding to the first logic level increases. For example, for the 4-bit digital signal DS1 initially set to be "1000", the up/down counter 31 outputs the 4-bit digital signal DS1 decreased to "0111", "0101", . . . or "0001" according to the width of the pulse width corresponding to the first logic level of the second comparison signal PWM2.

The DAC 33 receives the n-bit digital signal DS1 output from the up/down counter 31, converts the received digital signal DS1 to an analog signal, and generates the first control signal OUTp and the second control signal OUTn. Each of the first and second control signals OUTp and OUTn is increased by a predetermined voltage as the n-bit digital signal DS1 increases and is decreased by a predetermined voltage as the n-bit digital signal DS1 decreases. In other words, the first and second control signals OUTp and OUTn are complementary signals.

In other words, when the first feedback input signal INp has a DC offset greater than that of the second feedback input signal INn, the DCOC circuit 20-1 outputs the first control signal OUTp having a negative (−) sign to the first input terminal (+) of the receiving circuit 15 so that the first control signal OUTp is subtracted from the first input signal Vinp, thereby decreasing the current flowing in the first input terminal (+), and the second control signal OUTn having a positive (+) sign to the second input terminal (−) of the receiving circuit 15 so that the second control signal OUTn is added to the second input signal Vinn, thereby increasing the current flowing in the second input terminal (−).

In addition, when the first feedback input signal INp has a DC offset smaller than that of the second feedback input signal INn, the DCOC circuit 20-1 outputs the first control signal OUTp having a positive (+) sign to the first input terminal (+) of the receiving circuit 15 so that the first control signal OUTp is added to the first input signal Vinp, thereby increasing the current flowing in the first input terminal (+), and the second control signal OUTn having a negative (−) sign to the second input terminal (−) of the receiving circuit 15 so that the second control signal OUTn is subtracted from the second input signal Vinn, thereby decreasing the current flowing in the second input terminal (−).

Thus, since the change in the voltage of the first and second control signals OUTp and OUTn of the DCOC circuit 20-1 changes the voltages of the first and second input signals Vinp and Vinn of the receiving circuit 15, the DC offset included in the first and second input signals Vinp and Vinn may be canceled in real time.

As described above, in the receiving system 10 of the present exemplary embodiment, since the first control signal OUTp generated by the DCOC circuit 20-1 is output to the first input terminal (+) of the receiving circuit 15 and the second control signal OUTn is output to the second input terminal (−) of the receiving circuit 15, based on the first feedback input signal INp and the second feedback input signal INn, the DC offset included in each of the first and second input signals Vinp and Vinn may be canceled.

Figure 3:
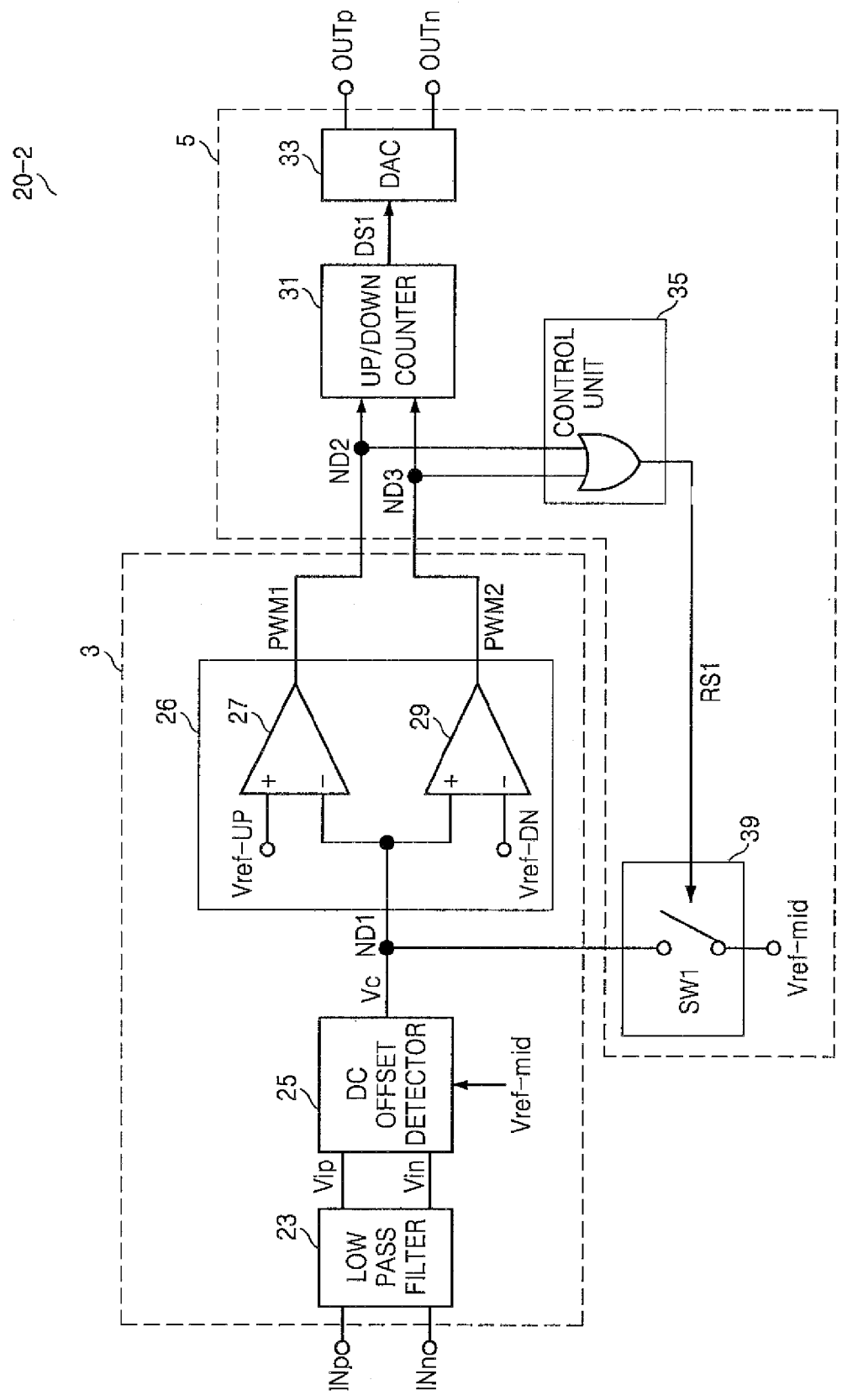
FIG. 3 is a block diagram of a DC offset correction circuit according an exemplary embodiment of the present invention.

FIG. 3 is a block diagram of a DCOC circuit 20-2 according an exemplary embodiment of the present invention. Referring to FIG. 3, the DCOC circuit 20-2 includes an analog circuit portion 3 and a digital circuit portion 5. The analog circuit portion 3 includes the low pass filter 23, the DC offset detector 25, and the comparator 26. The digital circuit portion 5 includes a control unit 35, a switching circuit 39, the up/down counter 31, and the DAC 33.

Since the structures and operations of the low pass filter 23, the up/down counter 31, and the DAC 33 are the similar to those described with reference to FIG. 2, detailed descriptions thereof will be omitted herein. The DC offset detector 25 detects a DC offset included in each of the first and second feedback input signals INp and INn based on the voltage difference between the first and second low pass filtered signals Vip and Vin output from the low pass filter 23. The DC offset detector 25 compares the detected DC offset and the first reference voltage Vref_mid and outputs the detection voltage Vc generated according to a result of the comparison to a first node ND1. The comparator 26 includes the first comparator 27 and the second comparator 29.

The first comparator 27 receives the second reference voltage Vref_UP via the first input terminal (+) and the detection voltage Vc output from the DC offset detector 25 via the second input terminal (−), compares the received second reference voltage Vref_UP and the received detection voltage Vc, and outputs the first comparison signal PWM1 via an output terminal ND2 according to a result of the comparison. The second comparator 29 receives the detection voltage Vc via the first input terminal (+) and the third reference voltage Vref_DN via the second input terminal (−), compares the received detection voltage Vc and the received third reference voltage Vref_DN, and outputs the second comparison signal PWM2 via an output terminal ND3 according to a result of the comparison.

The control unit 35 is connected between the pair of output terminals ND2 and ND3 of the first and second comparators 27 and 29 and the switching unit 39. The control unit 35 receives the first comparison signal PWM1 output from the first comparator 27 and/or the second comparison signal PWM2 output from the second comparator 29 and outputs a reset signal RS1 in response to the received first comparison signal PWM1 and/or the received second comparison signal PWM2.

In the present exemplary embodiment, the control unit 35 may be embodied by a logic gate, for example, a NOR gate. The switching unit 39 includes a first switch SW1 and is connected between the first node ND1 to output the detection voltage Vc from the DC offset detector 25 and a node to receive the first reference voltage Vref_mid. The first switch SW1 is turned on in response to the reset signal RS1 and initializes the voltage of the first node ND1 to the first reference voltage Vref_mid. In other words, the first switch SW1, in response to the first comparison signal PWM1 or the second comparison signal PWM2, initializes the second input terminal (−) of the first comparator 27 and the first input terminal (+) of the second comparator 29 to the first reference voltage Vref_mid.

As described above, the receiving system 10 initializes the voltage of the first node ND11 to the first reference voltage Vref_mid whenever the DCOC circuit 20-2 generates control voltages to cancel the DC offset included in each of the input signals Vinp and Vinn of the receiving circuit 15, so that a change in the DC offset included in each of the input signals Vinp and Vim that will be subsequently received may be quickly detected in real time.

A characteristic of the output signals, for example, the control signals OUTp and OUTn, of the DCOC circuit 20-x according to an exemplary embodiment of the present invention, where "x" is a natural number, for example x=1 or x=2, will be described with reference to FIGS. 4 and 5. FIG. 4 illustrates the control signals OUTp and OUTn generated according to the detection voltages Vc of the DCOC circuits 20-x of FIGS. 2 and 3 according to an exemplary embodiment of the present invention. FIG. 5 illustrates the control signals OUTp and OUTn generated according to the detection voltages Vc of the DCOC circuits 20-x of FIGS. 2 and 3 according to an exemplary embodiment of the present invention. In other words, FIGS. 4 and 5 illustrate the control signals OUTp and OUTn of the DCOC circuit 20-x generated according to the detection voltage Vc generated based on the DC offset included in each of the first and second feedback input signals INp and INn.

The DC offset detector 25 receives the first and second low pass filtered signals Vip and Vin generated based on the first and second feedback input signals Vinp and Vinn and detects a DC offset based on the voltage difference between the first and second low pass filtered signals Vip and Vin. The DC offset detector 25 compares the detected DC offset and the first reference voltage Vref_mid and outputs the detection voltage Vc according to a result of the comparison.

Figure 4:
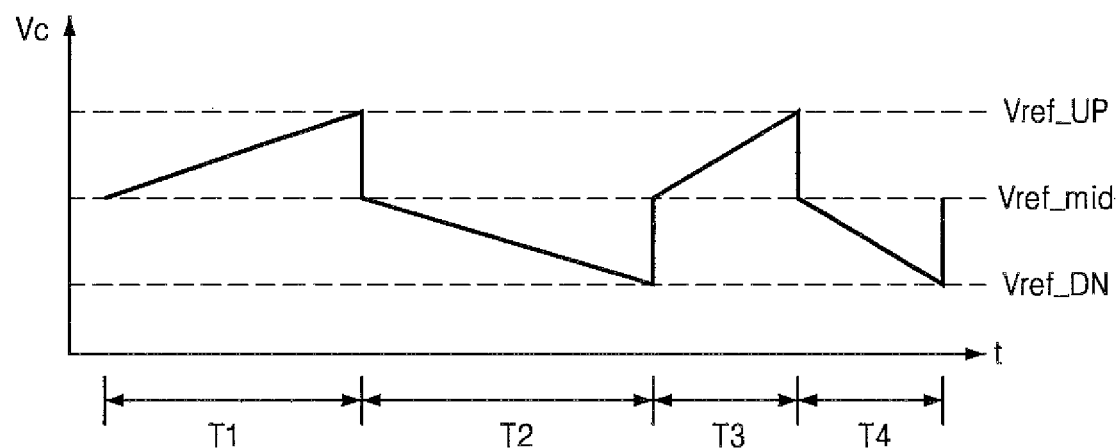
FIG. 4 illustrates control signals generated according to the detection voltages of the DC offset correction circuits of FIGS. 2 and 3 according an exemplary embodiment of the present invention.
Figure 4:
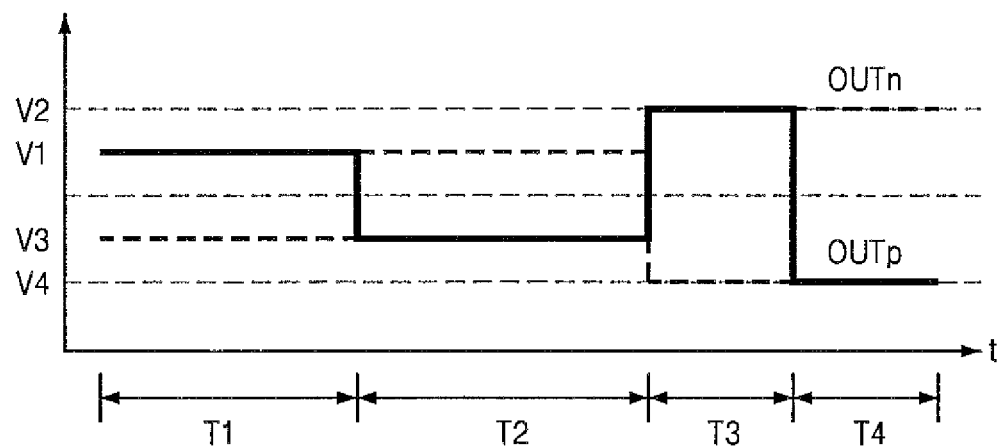
Figure 5:
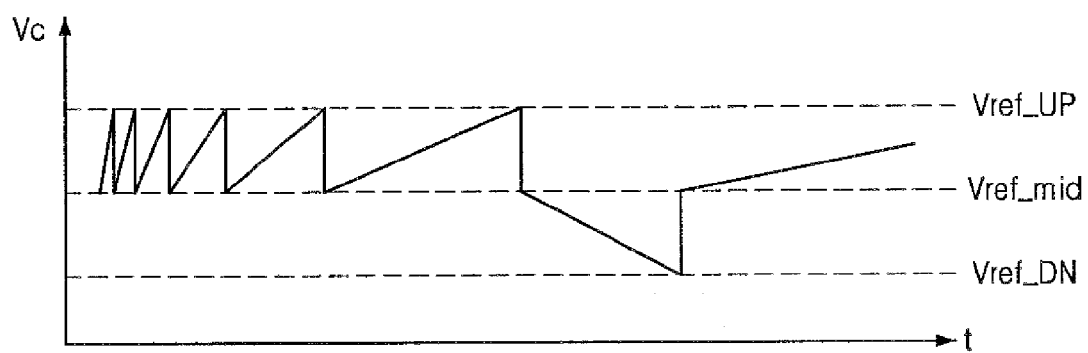
FIG. 5 illustrates control signals generated according to the detection voltages of the DC offset correction circuits of FIGS. 2 and 3 according an exemplary embodiment of the present invention.
Figure 5:
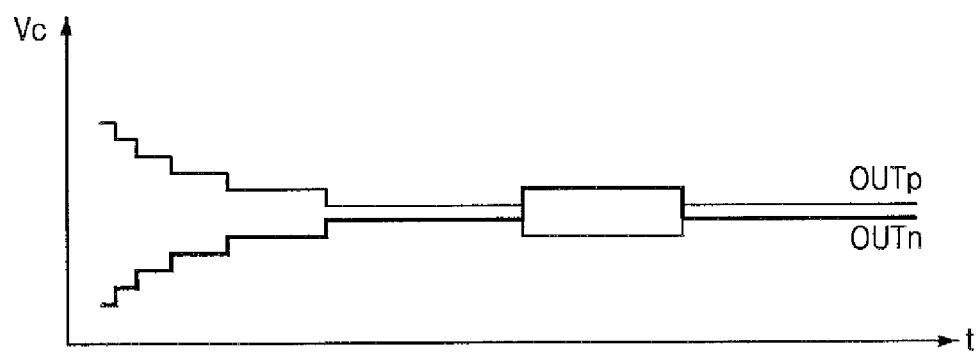

For example, as a result of the comparison, during the section in which the detection voltage Vc reaches the second reference voltage Vref_UP, that is, during a first section T1 and a third section T3 as shown in FIG. 4, the first comparator 27 compares the detection voltage Vc and the second reference voltage Vref_UP and generates the first control signal OUTp having a positive (+) sign as a result of the comparison. In other words, in the first section T1 in which the detection voltage Vc reaches the second reference voltage Vref_UP, the DCOC circuit 20-x generates a first correction voltage V1 as the first control signal OUTp and a third correction voltage V3 as the second control signal OUTn. The first and third correction voltages V1 and V3 may be complementary signals.

In addition, in the third section T3 in which the detection voltage Vc reaches the second reference voltage Vref_UP faster than it does in the first section T1, the DCOC circuit 20-x generates a second correction voltage V2 greater than the first correction voltage V1 as the first control signal OUTp.

As a result of the comparison, in a section in which the detection voltage Vc reaches the third reference voltage Vref_DN, that is, in a second section T2 and a fourth section T4 as shown in FIG. 4, the second comparator 29 compares the detection voltage Vc and the third reference voltage Vref_DN and generates the first control signal OUTp having a negative (−) sign according to a result of the comparison.

In other words, in the second section T2 in which the detection voltage Vc reaches the third reference voltage Vref_DN, the DCOC circuit 20-x generates a third correction voltage V3 as the first control signal OUTp and the first correction voltage V1 as the second control signal OUTn. The first correction voltage V1 and the third correction voltage V3 may be complementary signals. In addition, in the fourth section T4 in which the detection voltage Vc reaches the third reference voltage Vref_DN faster than it does in the second section T2, the DCOC circuit 20-x generates a fourth correction voltage V4 greater than the third correction voltage V3 as the first control signal OUTp.

As described above, the detection voltage Vc reaches the second reference voltage Vref_UP or the third reference voltage Vref_DN faster as the amount (or amplitude) of the DC offset included in each of the first and second feedback input signals Vinp and Vinn output from the receiving circuit 15 increases. Accordingly, the DCOC circuit 20-x outputs a relatively higher correction voltage when the detection voltage Vc relatively quickly reaches the second reference voltage Vref_UP or the third reference voltage Vref_DN, and a relatively lower correction voltage when the detection voltage Vc relatively slowly reaches the second reference voltage Vref_UP or the third reference voltage Vref_DN.

In addition, as shown in FIG. 4 and/or FIG. 5, since the detection voltage Vc is initialized to the first reference voltage Vref_mid whenever the detection voltage Vc reaches the second reference voltage Vref_UP or the third reference voltage Vref_DN and the control signals OUTp and OUTn are generated, a change in the DC offset included in each of the input signals Vinp and Vinn that will be received subsequently may be quickly detected in real time.

In the DCOC circuit 20-x according to an exemplary embodiment of the present invention, since the correction voltages, for example, the control signals OUTp and OUTn, are adjusted according to the amount of the DC offset included in the feedback input signals Vinp and Vimn, the DC offset may be stably canceled. In addition, since the digital circuit portion 5 occupying a relatively small area and the analog circuit portion 3 occupying a relatively large area can be combined as shown in FIGS. 2 and 3, for example, the layout of the receiving system 10 may be reduced.

Thus, the receiving system 10 according to an exemplary embodiment of the present invention provides the receiving circuit 15 that can be optimized for a channel or a system environment so that a semiconductor device may be stably operated with less power consumption. The DCOC circuit 20-x according to an exemplary embodiment of the present invention may be applied not only to a transmission system but also to semiconductor devices and other electronic devices requiring a DCOC circuit, for example.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A DC offset correction circuit, comprising:
a DC offset detector generating a detection voltage based on a result of a comparison of a first reference voltage and a voltage difference between signals input to the DC offset detector;
a comparator comparing a second reference voltage and the detection voltage and a third reference voltage and the detection voltage and outputting first and second comparison signals, respectively, as a result of the comparisons; and
an up/down counter performing an up or a down count operation in response to one of the first or second comparison signals and, as a result of the up or down count operation, outputting a signal that causes at least one control signal for canceling a DC offset in a signal input to a receiver to be generated,
wherein the comparator comprises:
a first comparator comparing the detection voltage and the second reference voltage and outputting the first comparison signal; and
a second comparator comparing the detection voltage and the third reference voltage and outputting the second comparison signal, and
wherein the comparator increases a first pulse width of the first comparison signal to a first logic level of the first comparison signal during a first time in which the detection voltage reaches the second reference voltage and increases a second pulse width of the second comparison signal to a first logic level of the second comparison signal during a second time in which the detection voltage reaches the third reference voltage.

2. The DC offset correction circuit of claim 1, further comprising:
a digital-to-analog converter that converts the signal output from the up/down counter, which is a digital signal, to an analog signal to generate a first control signal and a second control signal.

3. The DC offset correction circuit of claim 1, wherein the first or second pulse widths are increased according to an amount of the detection voltage.

4. The DC offset correction circuit of claim 1, further comprising:
a low pass filter low pass filtering signals output from the receiver and outputting the low pass filtered signals as the signals input to the DC offset detector.

5. A DC offset correction circuit, comprising:
a DC offset detector generating a detection voltage based on a result of a comparison of a first reference voltage and a voltage difference between signals input to the DC offset detector;
a comparator comparing a second reference voltage and the detection voltage and a third reference voltage and the detection voltage and outputting first and second comparison signals, respectively, as a result of the comparisons;
an up/down counter performing an up or a down count operation in response to one of the first or second comparison signals and, as a result of the up or down count operation, outputting a signal that causes at least one control signal for canceling a DC offset in a signal input to a receiver to be generated;
a control unit outputting a reset signal in response to at least one of the first or second comparison signals; and
a switching unit initializing the detection voltage to the first reference voltage in response to the reset signal.

6. A DC offset correction circuit, comprising:
a DC offset detector generating a detection voltage based on a result of a comparison of a first reference voltage and a voltage difference between signals input to the DC offset detector;
a comparator comparing a second reference voltage and the detection voltage and a third reference voltage and the detection voltage and outputting first and second comparison signals, respectively, as a result of the comparisons; and
an up/down counter performing an up or a down count operation in response to one of the first or second comparison signals and, as a result of the up or down count operation, outputting a signal that causes at least one control signal for canceling a DC offset in a signal input to a receiver to be generated,
wherein the comparator comprises:
a first comparator comparing the detection voltage and the second reference voltage and outputting the first comparison signal; and
a second comparator comparing the detection voltage and the third reference voltage and outputting the second comparison signal, and
wherein the second reference voltage is higher than the first reference voltage and the third reference voltage is lower than the first reference voltage.

7. A receiving system, comprising:
a receiving circuit receiving differential input signals each including a DC offset, amplifying the received differential input signals and outputting the amplified differential signals as differential output signals; and
a DC offset correction circuit canceling the DC offset included in each of the differential input signals by providing control signals that correspond to the DC offset in each of the differential output signals to the receiving circuit,
wherein the DC offset correction circuit comprises:
a DC offset detector generating a detection voltage based on a result of a comparison of a first reference voltage and a voltage difference between the differential output signals received thereby;
a comparator comparing a second reference voltage and the detection voltage and a third reference voltage and the detection voltage and outputting first and second comparison signals, respectively, as a result of the comparisons; and
an up/down counter performing an up or a down count operation in response to one of the first or second comparison signals and, as a result of the up or down count operation, outputting a signal that causes the control signals to be generated,
wherein the comparator increases a first pulse width of the first comparison signal to a first logic level of the first comparison signal during a first time in which the detection voltage reaches the second reference voltage and increases a second pulse width of the second comparison signal to a first logic level of the second comparison signal during a second time in which the detection voltage reaches the third reference voltage.

8. The receiving system of claim 7, wherein the comparator comprises:
a first comparator comparing the detection voltage and the second reference voltage and outputting the first comparison signal; and
a second comparator comparing the detection voltage and the third reference voltage and outputting the second comparison signal.

9. The receiving system of claim 7, wherein the DC offset correction circuit further comprises:
a digital-to-analog converter that converts the signal output from the up/down counter, which is a digital signal, to an analog signal to generate the control signals.

10. The receiving system of claim 7, wherein the DC offset correction circuit further comprises:
a control unit outputting a reset signal in response to at least one of the first or second comparison signals; and
a switching unit initializing the detection voltage to the first reference voltage in response to the reset signal.

11. The receiving system of claim 7, wherein the first or second pulse widths are increased according to an amount of the detection voltage.

12. The receiving system of claim 7, wherein the DC offset correction circuit further comprises:
a low pass filter low pass filtering the differential output signals and outputting the low pass filtered signals to the DC offset detector.

13. A receiving system, comprising:
a receiving circuit receiving differential input signals each including a DC offset, amplifying the received differential input signals and outputting the amplified differential signals as differential output signals; and
a DC offset correction circuit canceling the DC offset included in each of the differential input signals by providing control signals that correspond to the DC offset in each of the differential output signals to the receiving circuit,
wherein the DC offset correction circuit comprises:
a DC offset detector generating a detection voltage based on a result of a comparison of a first reference voltage and a voltage difference between the differential output signals received thereby;
a comparator comparing a second reference voltage and the detection voltage and a third reference voltage and the detection voltage and outputting first and second comparison signals, respectively, as a result of the comparisons; and
an up/down counter performing an up or a down count operation in response to one of the first or second comparison signals and, as a result of the up or down count operation, outputting a signal that causes the control signals to be generated,
wherein the second reference voltage is higher than the first reference voltage and the third reference voltage is lower than the first reference voltage.

14. A method for canceling a DC offset in signals input to a receiving circuit, comprising:
receiving, at a receiving circuit, first and second input signals each including a DC offset;
amplifying, at the receiving circuit, the first and second input signals;
outputting, from the receiving circuit, the amplified first and second input signals as first and second output signals;
receiving, at a DC offset correction circuit the first and second output signals;
generating, at the DC offset correction circuit, a detection voltage based on a result of a comparison of a first reference voltage and a voltage difference between the first and second output signals;
comparing, at the DC offset correction circuit, a second reference voltage and the detection voltage and a third reference voltage and the detection voltage and outputting first and second comparison signals, respectively, as a result of the comparisons;
performing, at the DC offset correction circuit, an up or a down count operation in response to one of the first or second comparison signals and, as a result of the up or down count operation, outputting a digital signal;
generating, at the DC offset correction circuit, first and second control signals in response to the digital signal;
outputting, from the DC offset correction circuit, the first and second control signals; and
adding or subtracting the first and second control signals to/from the first and second input signals, respectively, to cancel the DC offset included therein,
wherein a pulse width of the first comparison signal is increased or decreased based on a time it takes the detection voltage to reach the second reference voltage and a pulse width of the second comparison signal is increased or decreased based on a time it takes the detection voltage to reach the third reference voltage.

15. The method of claim 14, wherein a value of the digital signal depends on the pulse width of at least one of the first or second comparison signals and the value of the digital signal determines how much voltage is to be added to or subtracted from the first and second input signals.

* * * * *